Sept. 20, 1971 S. G. COON, JR 3,605,999

INSULATIVE COATED METAL SUBSTRATES AND APPARATUS FOR HOLDING SUBSTRATES

Filed July 23, 1969

INVENTOR.
SENECA G. COON, JR.
BY
D. Gordon Angus
ATTORNEY

United States Patent Office 3,605,999

Patented Sept. 20, 1971

3,605,999

INSULATIVE COATED METAL SUBSTRATES AND APPARATUS FOR HOLDING SUBSTRATES

Seneca G. Coon, Jr., Glendora, Calif., assignor to Aerojet-General Corporation, El Monte, Calif.

Filed July 23, 1969, Ser. No. 844,104
Int. Cl. B65d *73/02, 85/54, 85/62*
U.S. Cl. 206—1R 8 Claims

ABSTRACT OF THE DISCLOSURE

A substrate according to this disclosure comprises a metallic sheet having an insulative layer on one surface thereof for supporting a microcircuit. The substrates preferably have beveled edges so that similar substrates may be positioned in apparatus whereby the beveled side edges of the substrates react against beveled edges of a slot in the apparatus and beveled edges of contiguous substrates react against each other to hold all of the substrates in place.

This invention relates to thin film circuits, and particularly to substrates for thin film microcircuits and apparatus for holding mircocircuit substrates.

This film microcircuits are often formed by depositing materials onto substrates in such a manner as to form the circuit. Heretofore, two types of substrates have been used for microcircuits: insulative materials such as glass and semiconductor materials. Insulative substrates have been useful in microcircuits because the various elements of the circuit could not short out through the substrate. Semiconductor substrates have been useful where active elements had formed part of the circuit, and the semiconductor substrate formed a portion of the active elements.

One problem associates with insulative and semiconductor substrates was that such substrates were easily fractured and required careful handling to avoid damage to the circuit. If the substrate should become fractured, the electrical characteristics of the circuit could be altered. In some cases, circuit elements became short-circuited or open-circuited due to fractured substrates, thereby rendering the microcircuit useless.

It is an object of the present invention to provide substrates for thin-film microcircuits which are not readily fractured.

It is another object of the present invention to provide substrates for thin film microcircuits which comprise a metal sheet having a layer of insulative material disposed thereon.

With the trend toward developing smaller packages of thin-film microcircuits, the problems associated with handling the microcircuit substrates and holding the substrates in position both for storage as well as during manufacturing operations is increasing. Accordingly, it is another object of the present invention to provide apparatus for holding substrates in storage and during manufacturing processes, which apparatus will hold a maximum number of substrates within a given area and provide protection for the microcircuit supported on the substrate.

In accordance with the present invention, a substrate is provided having a metal sheet provided with an insulative layer. By way of example, one side of the metal substrate may be provided with a glass layer which, in turn, supports the microcircuit. The glass layer prevents shorting out of the circuit elements and the metallic sheet provides structural support for the substrate.

According to an optional and desirable feature of the present invention, the sides of the substrate are beveled and a frame is provided whereby several similar substrates having beveled edges may be positioned together within the frame so that the beveled edges of contiguous substrates react against each other to hold the substrates in place.

According to another optional and desirable feature of the present invention, a cover may be bonded to the metal substrate to encapsulate the microcircuit on the insulative layer.

The above and other features of this invention will be more fully understood from the following detailed description and the accompanying drawings, in which.

Figures 1, 2, 3, 4, 5, 6, 7, 8, 9, 10:
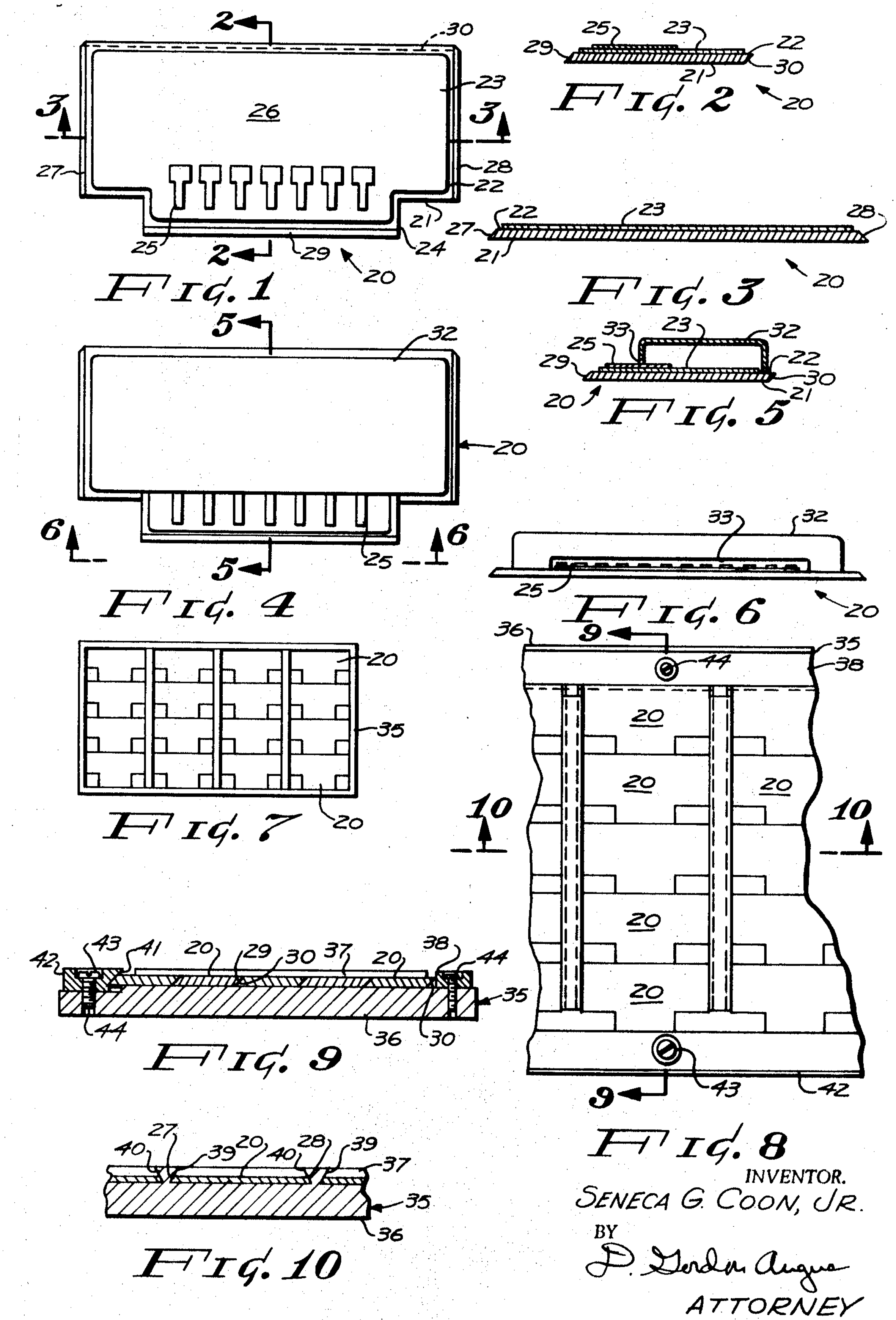
FIG. 1 is a top view of a substrate in accordance with the preferred embodiment of the present invention.
FIG. 2 is a section view taken at line 2—2 in FIG. 1.
FIG. 3 is a section view taken at line 3—3 in FIG. 1.
FIG. 4 is a top view of the substrate illustrated in FIG. 1 having a cover attached thereto.
FIG. 5 is a section view taken at line 5—5 in FIG. 4.
FIG. 6 is a front view taken at line 6—6 in FIG. 4.
FIG. 7 is a top view of a frame holding a plurality of substrates illustrated in FIG. 1.
FIG. 8 is an enlarged top view of a portion of the frame illustrated in FIG. 7.
FIG. 9 is a section view taken at line 9—9 in FIG. 8.
FIG. 10 is a section view taken at line 10—10 in FIG. 8.

Referring to the drawings, and particularly to FIGS. 1–3, there is illustrated a substrate 20 in accordance with the presently preferred embodiment of the present invention. Substrate 20 includes a metallic sheet 21 which may, for example, comprise an iron-nickel-cobalt alloy, and have a thickness of about 0.020 inch. Surface 22 of sheet 21 is provided with a layer 23 of insulative material. By way of example, layer 23 may comprise a glass layer having a thickness between 0.003 and 0.005 inch. As illustrated in the drawings, substrate 20 is preferably approximately rectangular having a forwardly disposed lip 24, and layer 23 of insulative material closely follows the configuration of the substrate. It is preferred, however, that an edge portion of surface 22 of metallic sheet 21 be exposed for purposes to be further explained hereinafter. It is to be understood, however, that the substrate may be of any particular configuration, such as square, and the particular configuration illustrated in the drawings is given by way of example, and not of limitation.

A plurality of contacts 25 may be deposited onto the glass layer 23 and to form terminal contacts for a microcircuit on area 26 of the glass layer 23. The microcircuit and metallic contacts 25 may be formed in any suitable manner well known in the art, such as by vapor deposition, and forms no part of the present invention.

As illustrated in the drawings, the side edges of sheet 21 are provided with bevels 27 and 28, respectively, the front edge of lip 24 of sheet 21 is provided with bevel portion 29 and the rear edge of sheet 21 is provided with bevel portion 30.

The substrates may be formed by cutting iron-nickel-cobalt alloy sheet metal having a thickness of approximately 0.020 inch to the desired size and shape. The edges of the sheet may then be beveled by a suitable straddle grinding method or some other type of suitable beveling technique. Surface 22 of the sheet may be lightly sandblasted and thoroughly cleaned with suitable solvents. A finely powdered glass slurry may then be applied to the blanks by spraying it through a stencil to a depth sufficient to achieve a 0.003 to 0.005 inch thickness glass coating 23. By way of example, the glass slurry may be formed by smelting a glass formulation at a temperature of about 2000° to 2500° F. and water quenching the molten glass to form the glass particles called "frit." The glass frit is then ball milled with water and clay to form a water suspension of minus 200 mesh glass particles. This water suspension is the slurry. After the glass slurry is applied to the surface 22, the substrates are placed in a controlled atmosphere furnace and the glass layer is fired at a temperature of between about 950° and 1650° F., the firing temperature depending upon the glass formulation. After cooling, the substrates are removed and are ready for use.

Another method of applying the glass to the metal substrate is by means of a glass transfer tape which is commercially available in thickness of between 0.0002 and 0.050 inch from the Vitta Corporation of Wilmington, Conn.

As illustrated particularly in FIGS. 4–6, inclusive, the circuit on substrate 20 may be encapsulated within a cover 32 which may be constructed of the same type of material as sheet 21. Cover 32 is bonded to surface of sheet 21 outside of the area of the glass layer 23. The bond between cover 32 and sheet 21 may be any suitable type of bond such as inert silicon encapsulating resin. As illustrated particularly in FIG. 6, opening 33 is provided in cover 32 to permit access to terminals 25 on the substrate. Preferably, opening 33 is so sized as to prevent cover 32 from shorting terminals 25, and yet permit hermetically sealing the opening with encapsulating resin (not shown).

In FIG. 7 there is illustrated a frame 35 for holding a plurality of the substrates 20 in accordance with the present invention. The relationship of the substrates and frame are illustrated in greater detail in FIGS. 8–10. Frame 35 comprises a metal plate 36 having a plurality of beveled slots 37 formed in one face thereof. As illustrated particularly in FIGS. 8 and 9, retaining bar 38 is fastened to plate 36 by fastener 44 and engages an edge of one of the substrates 20 in each slot. Slot 37 includes beveled side portions 39 and 40 adapted to mate with the beveled side edges 27 and 28, respectively, of substrates 20. With exception of the substrate whose beveled edge 30 contacts retaining bar 38, the rear beveled edge 30 of every other substrate in slot 37 is engaged to the front beveled edge 29 of the next contiguous substrate. The forward beveled edge 29 of the most forwardly disposed substrate is engaged by the beveled surface 41 of lock bar 42. Lock bar 42 is positioned against all of the most forwardly disposed substrates 20 and held in position by sandwiching the bar between the head of threaded fastener 43 and plate 36. Fastener 43 is threadably engaged to threaded opening 44 in plate 36.

In operation of the frame 35 illustrated in the drawings, bar 42 is removed from its position and the substrates are slid into the slots 37 to that the beveled edges react against each other within the slot as herein before described. Bar 42 is then positioned so that its beveled edge engages the most forwardly disposed substrate so that all of the substrates reacts against each other to remain in position within the slots 37. The position of bar 42 is fixed by threaded fastener 43.

The present invention thus provides a substrate which is capable of withstanding severe loads and is durable. The substrate will not fracture under ordinary use and yet is provided with an insulative layer so as to insulate the circuit elements and prevent short circuiting. The substrate has all of the advantages of an insulative substrate and has a metal base for strength. Apparatus is provided for holding substrates so as to provide a maximum number of substrates in a minimum area. The frame is particularly useful during fabrication and circuit deposition processes.

The invention is not to be limited by the embodiments shown in the drawings, and described in the description, which are given by way of example and not of limitation.

What is claimed is:

1. In combination: a frame for holding a plurality of substrates comprising a plate having slot means, said slot means having beveled sides; lock means attached to said plate adapted to react against an edge of a substrate at each end of said slot means; a plurality of substrates having beveled edges, said substrates being positioned in said slot means so that the side edges of each of said substrates react against the respective beveled sides of said slot means and a beveled edge of each of said substrates reacts against a beveled edge of a contiguous substrate.

2. Apparatus according to claim 1 wherein said slot means comprises a plurality of slots.

3. Apparatus according to claim 2 wherein said lock means comprises a bar adapted to react against a beveled edge of a substrate in each of said plurality of slots.

4. Apparatus according to claim 1 wherein said substrate comprises a sheet of metallic material and a layer of insulative material bonded to a surface of said sheet, said layer of insulative material being adapted to support a microcircuit.

5. Apparatus according to claim 4 wherein said insulative material is glass.

6. Apparatus according to claim 4 wherein said sheet of metal has a thickness of about 0.020 inch and said layer of insulative material is between about 0.003 and 0.005 inch thick.

7. Apparatus according to claim 4 wherein the beveled edges of said substrate are formed in said sheet.

8. Apparatus according to claim 7 further including a metallic cover bonded to said surface of said sheet, said cover being adapted to cover the microcircuit on said layer of insulative material.

References Cited

UNITED STATES PATENTS

| | | | |
|---|---|---|---|
| 2,119,773 | 6/1938 | Buckner | 206—0.84 |
| 2,965,219 | 12/1960 | Rhodin | 206—1R |
| 3,524,541 | 8/1970 | Nelson | 206—1R |
| 3,239,719 | 3/1966 | Shower | 317—101 |
| 3,388,302 | 6/1968 | McManus | 317—234 |
| 3,484,534 | 12/1969 | Kilby et al. | 174—52 |
| 3,489,956 | 1/1970 | Yanai et al. | 317—234 |
| 3,509,434 | 4/1970 | Yanai et al. | 317—235 |

FOREIGN PATENTS

| | | | |
|---|---|---|---|
| 342,660 | 1/1960 | Switzerland | 317—234 |

WILLIAM T. DIXSON, JR., Primary Examiner

U.S. Cl. X.R.

174—68.5; 206—65; 317—234